United States Patent [19]

Ohdate

[11] 4,274,106
[45] Jun. 16, 1981

[54] EXPLOSION PROOF VIBRATION RESISTANT FLAT PACKAGE SEMICONDUCTOR DEVICE

[75] Inventor: Mitsuo Ohdate, Itami, Japan

[73] Assignee: Mitsubishi Denki Kabushiki Kaisha, Tokyo, Japan

[21] Appl. No.: 957,330

[22] Filed: Nov. 3, 1978

[30] Foreign Application Priority Data

| Nov. 7, 1977 | [JP] | Japan | 52-133787 |
| Nov. 7, 1977 | [JP] | Japan | 52-149700[U] |
| Nov. 30, 1977 | [JP] | Japan | 52-144320 |
| Jun. 9, 1978 | [JP] | Japan | 53-70098 |

[51] Int. Cl.$^3$ .................... H01L 23/42; H01L 23/44; H01L 23/46
[52] U.S. Cl. ...................... 357/79; 357/74; 357/68; 357/81; 357/82
[58] Field of Search .............. 357/74, 75, 76, 79, 357/81, 82, 68

[56] References Cited

U.S. PATENT DOCUMENTS

| 3,265,805 | 8/1966 | Carlan et al. | 357/81 |
| 3,292,056 | 12/1966 | Emeis et al. | 357/79 |
| 3,296,506 | 1/1967 | Steinmetz | 357/81 |
| 3,443,168 | 5/1969 | Camp et al. | 357/79 |
| 3,581,163 | 5/1971 | Eriksson | 357/81 |
| 3,688,163 | 8/1972 | Daniels | 357/81 |
| 3,721,867 | 3/1973 | Schierz | 357/79 |
| 3,837,000 | 9/1974 | Platzoeder | 357/79 |
| 4,099,201 | 7/1978 | Mueller | 357/81 |
| 4,141,030 | 2/1979 | Eisele et al. | 357/81 |
| 4,150,394 | 4/1979 | Sugawa et al. | 357/81 |
| 4,162,514 | 7/1979 | DeBruyne | 357/79 |

FOREIGN PATENT DOCUMENTS

1912041  9/1969  Fed. Rep. of Germany ............ 357/82

Primary Examiner—Andrew J. James
Attorney, Agent, or Firm—Robert E. Burns; Emmanuel J. Lobato; Bruce L. Adams

[57] ABSTRACT

Two opposite electrodes are disposed at both ends of a hollow, electrically insulating cylinder to sandwich a semiconductor element between them and connected to those ends through thin metallic annuli respectively. The semiconductor element is physically isolated from each of the metallic annuli either by an annular member interposed between a circumferential protrusion of each electrode and the hollow cylinder or by contacting directly the protrusion with the cylinder. The annulr member may be resilient or not elastically deformable.

17 Claims, 21 Drawing Figures

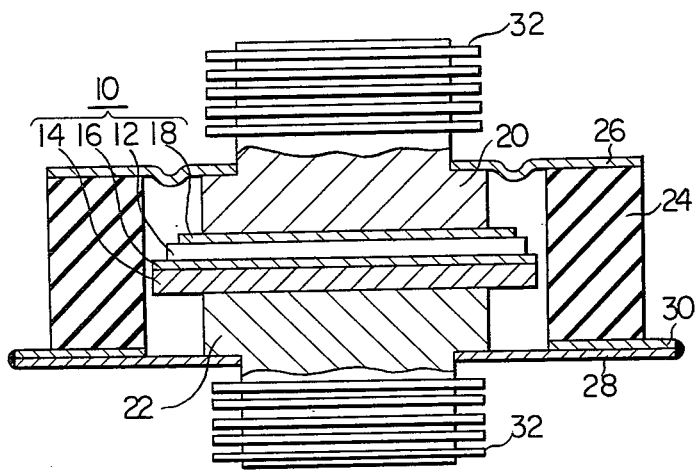
FIG. 1 PRIOR ART
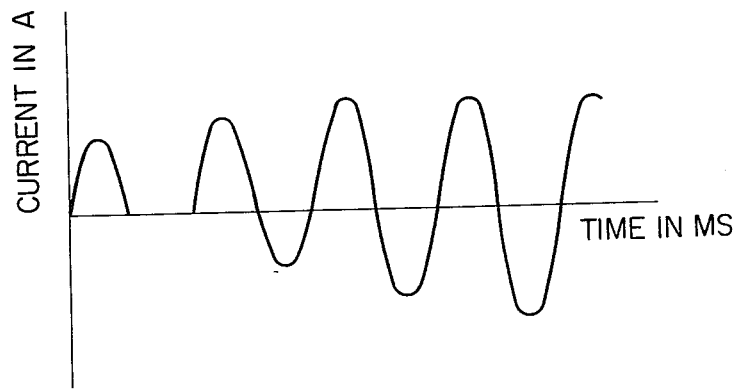
FIG. 2
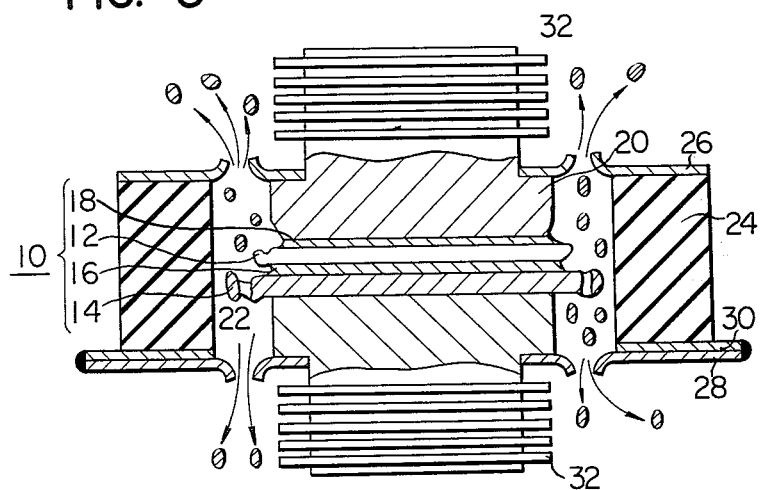
FIG. 3
FIG. 6a   FIG. 6b   FIG. 6c   FIG. 6d   FIG. 6e
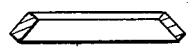 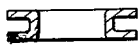   

EXPLOSION PROOF VIBRATION RESISTANT FLAT PACKAGE SEMICONDUCTOR DEVICE

BACKGROUND OF THE INVENTION

This invention relates to improvements in a flat package semiconductor device used as a high power semiconductor rectifier element, a high power transistor or the like, and more particularly to improvement in ability of such a device to withstand a rupture due to a flow of shortcircuit current through the device.

Lately it is being strongly promoted to make semiconductor devices and particularly power semiconductor devices high-powered and/or small sized. However, as the current capacity of semiconductor devices becomes higher, it has been difficult to protect the semiconductor devices by associated fuses and to bring the devices and fuses into harmony. Where a suitable fuses can not be available, a shortcircuit current flowing through a mating semiconductor device is, in the worst case, equal to several times its rating surge current within a few cycles of the system current until the fuse is blown. If this shortcircuit current is sufficiently high then it melts only a semiconductive material, for example, silicon forming of a semiconductor element disposed in the semiconductor device but also electrodes formed on the semiconductor element of a good thermally and electrically conductive material such as copper or aluminum. In addition, an inert gas filling the semiconductor device may be expanded resulting in an explosion occurring therein. This explosion of the gas might bring about a serious damages to and an important disasters of external devices.

Accordingly, it is an object of the present invention to provide a new and improved flat package semiconductor device free from a danger that any explosion will occur even though an excessive shortcircuit current would flow therethrough.

It is another object of the present invention to provide a new and improved flat package semiconductor device having a resistance to mechanical vibrations sufficient to prevent the airtightness from being injured with any vibration having a high acceleration and applied to the device for a long time.

SUMMARY OF THE INVENTION

The present invention provides a flat package semiconductor device comprising, in combination, a hollow, electrically insulating cylinder, a pair of electrodes disposed in opposite relationship on both opposite end surfaces of the hollow, electrically insulating cylinder, and a semiconductor element sandwiched between the pair of cylindrical electrodes. A metallic annulus including an outer periphery hermetically connected to each of the end surfaces of the hollow, electrically insulating cylinder and an inner periphery hermetically supporting each of said electrodes supports a circumferential protrusion radially outward extending from each of the cylindrical electrodes within the hollow, electrically insulating cylinder. The electrically insulating cylinder has an internal inwardly extending circumferential protrusion between the circumferential protrusions of the electrodes which are spaced axially. Means for isolating physically the semiconductor element from the associated thin metallic annulus is disposed under compression between the internal protrusion of the insulating cylinder and the circumferential protrusions of the electrodes.

Preferably, the means is comprised of an annular resilient member interposed between the circumferential protrusion and the internal protrusion of the hollow, electrically insulating cylinder to isolate physically the semiconductor element from the associated thin metallic annulus.

The circumferential protrusion may be formed to be deformable in a direction of thickness of the semiconductor element and directly contacted by the hollow, electrically insulating cylinder.

The annular resilient member may be replaced by an annular blocking member formed of a material high in both melting point and heat of fusion and not elastically deformable.

Also the circumferential protrusion may directly contact the hollow, electrically insulating cylinder.

BRIEF DESCRIPTION OF THE DRAWINGS

The present invention will become more readily apparent from the following detailed description taken in conjunction with the accompanying drawings in which:

FIG. 1 is a longitudinal sectional view, partly in elevation, of a conventional flat package power semiconductor device with parts broken away;

FIG. 2 is a current waveform illustrating, by way of example, the shortcircuit current flowing through power planar semiconductor devices such as shown in FIG. 1;

FIG. 3 is a view similar to FIG. 1 but illustrating one example of the rupture of the arrangement as shown in FIG. 1 resulting from a flow of shortcircuit current therethrough;

FIGS. 6a through 6e are sectional views of different modifications of the annular resilient shield shown in FIG. 5;

Throughout the Figures like reference numerals designate the identical or corresponding components.

DESCRIPTION OF THE PREFERRED EMBODIMENTS

Figure 4:
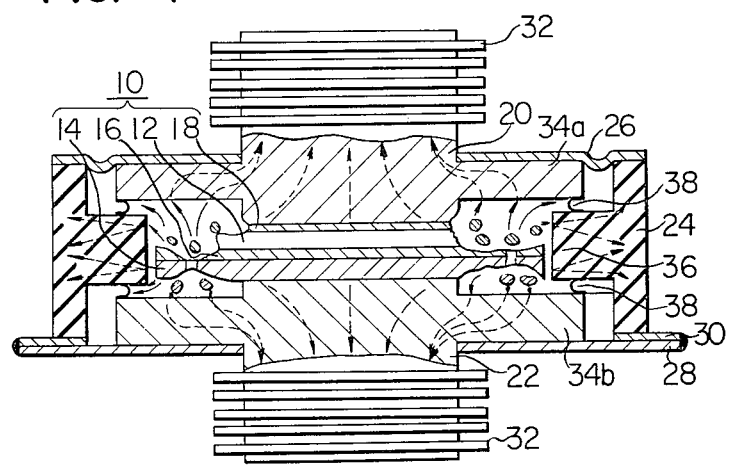
FIG. 4 is a longitudinal sectional view, partly in elevation, of one embodiment according to the flat package semiconductor device of the present invention with part cut away to illustrate molten piecelets from a semiconductor element and electrodes.

For a better understanding of the nature of the present invention, a conventional power flat package semiconductor device will now be described in conjunction with FIGS. 1, 2 and 3 of the drawings. In FIG. 1, a semiconductor rectifier element generally designated by the reference numeral 10 comprises a silicon substrate 12 having PNN+junctions (not shown) formed therein, a supporting plate 14 brazed to one of the main faces, in this case, the lower main face as viewed in FIG. 1 of the substrate 12 through a layer of Al-AlSi eutectic alloy 16, and an Al electrode layer 18 disposed in ohmic contact with the other or upper main face of the substrate 12. The supporting plate 14 is of molybdenum substantially equal in coefficient of thermal expansion to a semiconductor material in this case, silicon forming the semiconductor substrate 10 and the electrode layer 18 is formed on the upper main face of the substrate 10 by evaporating aluminum thereon.

Then the semiconductor rectifier element 10 is firmly sandwiched between a pair of first and second or upper and lower cylindrical electrodes 20 and 22 respectively by having the Al electrode layer 18 put in compressive contact with the upper electrode 20 and the supporting plate 18 similarly put in compressive contact with the lower electrode 22.

The assembly of the rectifier element and the upper and lower electrodes thus formed is located within a hollow, electrically insulating cylinder 24 formed, for example, of a ceramic material and put in place by a flexible metallic annulus 26 including its inner periphery brazed to a upper electrode 20 and an outer peripheral portion brazed to one end surface, in this case, the upper end surface as viewed in FIG. 1 of the hollow cylinder 24 on the one hand, and a flat metallic member 28 in the form of an annulus including an inner periphery brazed to a circumferential shoulder on the lower electrode 22 and an outer peripheral portion brazed to the other or lower end surface of the hollow cylinder 24 through a flange-shaped flat member 30 brazed to that end surface, on the other hand. The flexible annulus 26 is formed of thin sheet copper while the flat member 28 is formed of sheet iron or sheet iron-nickel alloy.

Each of the electrodes 20 or 22 is provided on the free end portion with a plurality of radiator fins 32.

A gas tight enclosure is formed of the opposite electrodes 20 and 22, the hollow cylinder 24, the flexible annulus 26 and the flange-shaped member 28 and filled with an amount of a suitable inert gas.

The arrangement of FIG. 1 is used by applying a pressure of several tons to the fins 30 to couple electrically and thermally the semiconductor element 10 to the opposite electrodes 20 and 22.

The arrangement shown in FIG. 1 may be broken due to a shortcircuit current flowing therethrough. When an AC voltage is applied across the electrodes 20 and 22 so as to permit a flow of a forward current higher than a rated forward surge current of the arrangement, the forward current can flow through the silicon substrate 12 in a first one of the cycles of the AC voltage as shown in FIG. 2 wherein a current in amperes is plotted in ordinate against time in milliseconds in abscissa. This causes the silicon substrate 12 to rise to a temperature of from 250° to 500° C. but a reverse current is blocked as shown in FIG. 2 without the PNN junctions broken. However, in the second cycle of the voltage, the temperature of the silicon substrate 12 further rises to from 1,200° to 2,000° C. This further rise of the temperature causes the PNN' junctions to be deprived of its rectifying function until a reverse current flows through the silicon substrate 12 as shown in FIG. 2. After the this flow of reverse current through the silicon substrate 12, the latter more and more increases in temperature until a shortcircuit current flows through the substrate 12 after the second cycles of the AC voltage as will readily be understood from the illustration of FIG. 2.

When the shortcircuit current is flowing through the silicon substrate 12 as above described, the latter reaches such a temperature that the layer of Al-AlSi eutectic alloy 16 and the Al electrode layer 18 located on both main faces of the substrate 12 respectively have temperatures exceeding their melting points respectively to vaporize those portions of both layers 16 and 18 disposed on the peripheral portion of the silicon substrate 12 on both main faces. This vaporization of the layers 16 and 18 is attended with high temperature electric arcs struck across the silicon substrate 12 and the first or upper electrode 20 and across the substrate 12 and the supporting plate 14 on the peripheral portion of the silicon substrate 12. Those high temperature electric arcs permit the melting of both the peripheral portion of the silicon substrate 12 and those portions of the first main electrode and supporting plate 20 and 14 located adjacent to that peripheral portion. This forms many melted piecelets which are in turn, scattered into a enclosed spaced within the enclosure as above described. At the same time, the inert gas filling that space is brought into plasma resulting in the abrupt expansion thereof.

In the arrangement shown in FIG. 1, the space defined by the first electrode 20, the second electrode 22, the hollow electrically insulating cylinder 24 etc. includes exposed thereto the flexible thin annulus 26 and the flange-shaped thin member 28. Those thin metallic members are contacted by the plasma of the filling gas to increase in temperature and further the melted piecelets therefrom strike against both the thin annulus 26 and the thin member 28. Under these circumstances, thermal energy included in the melted piecelets results in the thin members reaching their melting points while those portions thereof struck against the melted piecelets are bored. Therefore, the filling gas abruptly expanded as above described is explosively ejected into the exterior of the arrangement through the bores formed by the melted piecelets resulting in a rupture such as shown in FIG. 3.

Accordingly, conventional power flat package semiconductor devices such as shown in FIG. 1 have been disadvantageous in that the melted piecelets explosively ejected outside of the devices will cause serious diasters dependent upon the location thereof.

As an example, experiments have been conducted with power flat package semiconductor devices such as shown in FIG. 1 ensuring the forward surge current $I^{FSM}$ of 35,000 amperes and the square-of-current-time product $I^2t$ of $5 \times 10^6$ A$^2$S. The results of the experiments indicate that all the experimented devices have been broken with the applied voltage of 1,000 volts, the shortcircuit current of 170 kiloamperes and the square-of-current-time product of $20 \times 10^6$ A$^2$S.

The present invention contemplates to eliminate the disadvantage of the prior art practice as above described.

Referring now to FIG. 4, there is illustrated one embodiment according to the power flat package semiconductor device of the present invention. The arrangement illustrated is different from that shown in FIG. 3 only in that in FIG. 4, the first and second or upper and lower electrodes 20 and 22 respectively includes circumferential protrusions 34a and 34b radially outward extending therefrom to be substantially flush with both end surfaces of the hollow electrically insulating cylinder 24. Then the cylinder 24 includes a radially inward directed protrusion 36 extending from the middle portion of the entire inner periphery thereof to overlap the protrusions 34a and 34b to form a predetermined equal spacing therebetween. Then an annular metallic shield 38 of U-shaped cross section is resiliently held within each of the spacings due to its own resilience with the open end of the "U" facing the hollow cylinder 24. The annular shields 38 serves to block a passageway extending from the semiconductor element 12 to each of the flexible annulus and flat flange 26 and 28 respectively. That is, the shield 38 is effective for isolating physically the semiconductor element 12 from either one of the flexible annulus and flat member 26 and 28 respectively.

In the arrangement of FIG. 4, the melted piecelets formed through high temperature electric arcs and struck on the peripheral portion of the semiconductor substrate 12 collide only against the protrusion 34a, 34b and 36 as shown at the arrows in FIG. 4. Thereby, the melted piecelets can be prevented from colliding against the flexible annulus 26 and the flat member while both the annulus 26 and the member 28 are prevented from contacting directly the plasma of the filling inert gas resulting from the high temperature electric arcs. This is because each annular shield 38 is firmly held between each of the electrode protrusions 34a or 34b and the cylinder protrusion 36.

If the hollow, electrically insulating cylinder 24 has a high heat capacity and the electrode protrusions 34a and 34b are at least 1 millimeter thick, then thermal energy included in the melted piecelets are absorbed by the interior of the electrodes 20 and 22 and the hollow insulating cylinder 24 as shown at dotted lines in FIG. 4 until the melted piecelets are stuck to and solidified on the surface of the electrodes 20 and 22 including the protrusion 34a, 34b and of the electrically insulating cylinder 24 including the protrusion 38. If the melted piecelets concentrically collide against these protrusions 32a, 32b and 34 then high thermal energy included in the melted piecelets results in the fusion of the protrusions 34a, 34b and 36. Thus a large quantity of thermal energy spends for this fusion and also the accelerated melted piecelets are temporally stopped on the surface of the protrusions 34a, 34b and 36 with the result that the melted piecelets do not include thermal energy sufficient to melt and break the flexible annulus 26 and the flat member 28. Further only a few percent of the number of the melted piecelets tends to pass through the spacing formed between each of the electrodes protrusions 34a, or 34b and the cylinder's protrusion 36. However, as the shield 38 is located in this spacing to close it, the melted piecelets decreased in thermal energy are stuck to and solidified on the surface of the shield 36.

Thus the arrangement of FIG. 4 eliminates the disadvantages of the prior art practices as above described.

It will readily be understood that an annular spacing formed between the inner peripheral surface of the hollow, electrically insulating cylinder 24 and a protrusion of each main electrode 20 or 22 is determined by both a difference in coefficient of thermal expansion therebetween and the accuracy of finishing for the cylinder and electrodes. It has been found that, with each electrode formed into a diameter of 70 millimeters of copper, the spacing may have a radial distance of 0.6 millimeter. A spacing formed between the overlapped portions of the electrode's protrusion 34a or 34b and the cylinder's protrusion 36 may be determined by the shield 38 interposed thereinto. However, it is preferable to make an elastic force provided by the shield 38 smaller than that provided by each of the flexible annulus 36 and the flat member 28 connected to the electrodes 20 and 22 respectively.

Figure 5:
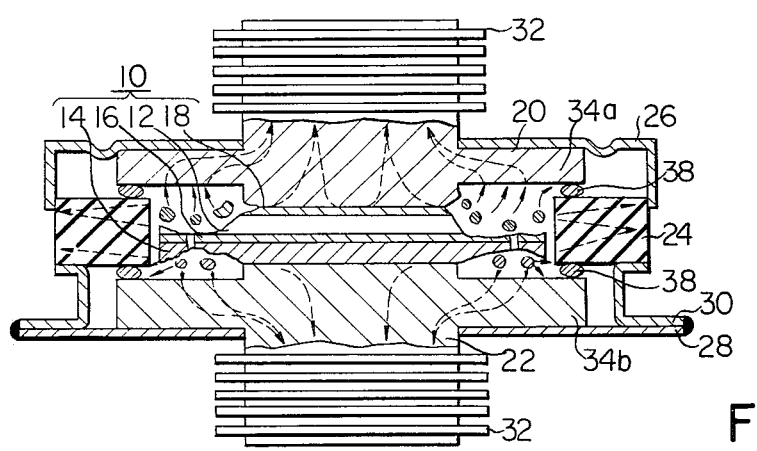
FIG. 5 is a view similar to FIG. 4 but illustrating a modification of the arrangement shown in FIG. 4.

The arrangement illustrated in FIG. 5 is different from that shown in FIG. 4 only in that in FIG. 5, the protrusions 34a and 34b extending from the upper and lower electrodes 20 and 26 respectively overlap the upper and lower end surface of the hollow, electrically insulating cylinder 24 to form predetermined spacing therebetween and the shield 38 is interposed into each of the spacings with the protrusion 36 as shown in FIG. 4 omitted.

FIGS. 6a through 6e shows in diametrical section, various shapes of the annular shield 38 that may be sandwiched between the protrusion 34a or 34b of the electrode 20 or 22 and the end surface or the protrusion 36 of the hollow cylinder 24. The shield 36 can be formed into an annulus of a sheet spring metal, for example, silver nickel, stainless steel, cupro-nickel or the like having a thickness ranging from 0.1 to 0.3 millimeter after which the annulus is worked to have an elasticity. For example, the shield 38 of a suitable sheet spring metal may be formed into a cross section of a tetragon including two parallel sides and at least one radially outer side tilted as shown in FIG. 6a, a U-shaped cross section as shown in FIG. 6b, or a hollow circular cross section as shown in FIG. 6e. Alternatively, an elastic, electrically insulating material such as silicone rubber or fluorine-containing rubber may be molded into a shape shown in FIG. 6c wherein there is illustrated a circular cross section or shown in FIG. 6d wherein there is illustrated a square cross section.

It has been experimentally found that the use of the shield 36 shown in FIG. 6b and 0.2 mm thick does not results in the rupture with the square of current-time product of $8 \times 10^7$ A$^2$S or less.

As above described, power semiconductor devices have lately increased in current capacity which is attended with large-scaled structures thereof. For example, if the semiconductor element 12 shown in FIG. 1 has its a maximum diameter of 120 millimeters, then the same is required to be disposed in a housing having an outside diameter as large as 170 millimeters. This is accompanied by the resulting semiconductor devices having a very large weight. Therefore, conventional semiconductor devices such as shown in FIG. 1 have encountered the following problems.

The semiconductor element 12 with a maximum diameter of 40 millimeters must be disposed within the hollow insulating cylinder 24 having a weight of about 90 grams. If the maximum diameter of the semiconductor element 12 increases to 120 millimeters then the weight of the hollow cylinder 24 amounts to 960 grams. With the hollow insulating cylinder very heavy as above described, the semiconductor device might be continuously applied with longitudinal mechanical vibrations for a long time as the semiconductor device equipped on vehicles. Under these circumstances, the flexible annulus 26 supporting the heavy hollow cylinder 24 might cause a fatigue rupture due to stresses repeatedly applied thereto to lose the gas tightness thereof. This has resulted in the serious disadvantage that the semiconductor element 12 deteriorates in electric characteristics until semiconductor devices including the deteriorated semiconductor element are disabled.

It has been experimentally found that semiconductor devices including the semiconductor element such as shown in FIG. 1 having a maximum diameter of 40 millimeters have withstood a mechanical vibration having an amplitude of 1.5 millimeters at a frequency 60 hertzs (which corresponds to an acceleration of 22 Gals) and with repetition cycles of 80,000 or more. However, with the maximum diameter of the semiconductor element increased to 120 millimeters, a large number of experimented semiconductor devices have been broken due to cracks occurring on the flexible annulus such as shown by 26 in FIG. 1 when they had been applied with a mechanical vibration having the parameters remaining unchanged from those described above and repetition cycles of 12,000. Therefore, the latter devices have had the lifetime equal to about seventh that of the former devices.

The present invention also contemplates to provide a flat package semiconductor device excellent in resistance to mechanical vibrations which will be subsequently described in conjunction with FIG. 7.

Figure 7:
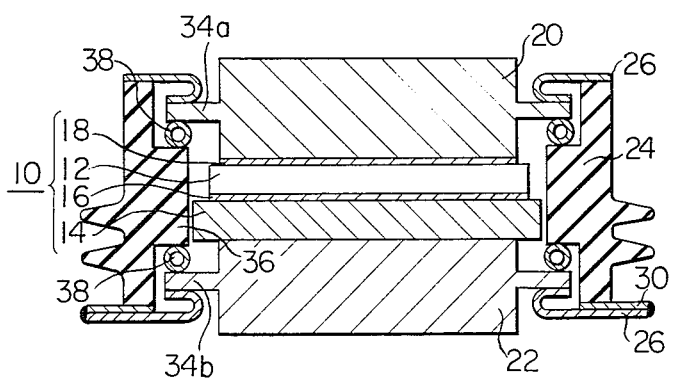
FIG. 7 is a view similar to FIG. 4 but illustrating a modification of the present invention.

The arrangement illustrated in FIG. 7 is different from that shown in FIG. 6 principally in that in FIG. 7 the shield 38 is interposed between the cylinder protrusion 36 and each of the electrode protrusion 34a or 34b. The shield 38 is formed of a metallic O-ring commercially available from Dainich-Nippon Densen Kabushiki Kaisha in Japan and having an elastic force higher than that of the flexible annulus 26. Also the flat member 28 is replaced by another flexible annulus similar to the upper flexible annulus 26 and designated by the same reference numeral 26.

In order to assemble the arrangement of FIG. 7, the first or upper electrode 29 is rigidly secured to the adjacent end surface, in this case, the upper end surface as viewed in FIG. 7 of the hollow, electrically insualting cylinder 24 through the flexible annulus 26 connected at one end to that end surface of the cylinder 24 and at the other end to the upper surface of the protrusion 34a of the upper electrode 20. The hollow insulating cylinder 24 has the flange-shaped member 30 attached to the lower end surface thereof. Then the O-ring 38 is inserted into the spacing formed between the protrusion 34a and 36. To this end, the O-ring 38 may be cut open along one radius thereof. After one of the cut ends of the O-ring 38 has been forcedly inserted into the spacing, the other end portion thereof is successively forced into the spacing while the O-ring is drawn about the other end thereof.

Subsequently, the semiconductor element 12 is disposed on the exposed surface of the electrode 20 and then another O-ring 38 is disposed on the protrusion 36 of the hollow, electric cylinder 24 having the flange-shaped member 30 brazed to the lower end surface thereof. The second electrode 22 with the flexible annulus brazed to the protrusion 34b thereof is disposed on the semiconductor element 12. Following this, the flexible annulus 28 is hermetically welded to the flange-shaped plate 30 in an atmosphere of inert gas through arc or resistance welding technique whereupon the arrangement is completed.

In the arrangement of FIG. 7 a pressure of a few tons is applied across the first and second electrodes 20 and 22 respectively to maintain the semiconductor element 12 in compressive contact with those electrodes while subjecting the O-ring 38 to an elastic deformation thereby to hold the hollow electrically insulating cylinder 24 by both electrodes 20 and 22 by means of an elastic force provided by each of the deformed O-rings 38. In other words, the hollow cylinder 24 is held indirectly to the electrodes 20 and 22 through the O-rings 38 serving also to isolate physically the semiconductor element 12 from each flexible annulus 26. It will readily be understood that, if each O-rings 38 having a strong elastic force and the protrusions 34a and 34b extending from the respective electrodes 20 and 22 to contact the O-rings 38 have sufficient thicknesses that the arrangement of FIG. 7 has a structure having a very high resistance to mechanical vibrations.

Flat package semiconductor devices such as shown in FIG. 7 have been formed of the following dimensions. The hollow, electrically insulating cylinder 24 has a weight of 960 grams; each of the electrodes 20 and 22 including the respective protrusions 34a and 34b has a maximum diameter of 128 millimeters; each of the protrusion 34a or 34b overlaps the protrusion 36 of the hollow cylinder 24 by a radial dimension of 4 millimeters; the protrusions 34a and 34b are 3 millimeter thick and the O-ring 38 is formed of sheet stainless steel 0.4 millimeter thick to have the outside diameter of 125 millimeters and a cross sectional diameter of 3 millimeters.

Then with a pressure of four tons applied across the electrodes 20 and 22, the devices have been subjected to vibration tests under the same vibration conditions as above described. The results of the tests have proved that the devices can satisfactorily withstand the repetion cycles of 80,000 or more. That is, the arrangement of FIG. 7 sharply increases in resistance to mechanical vibrations as compared with the prior art devices such as shown in FIG. 1. Accordingly, the explosion proof ability is also excellent.

Figure 8:
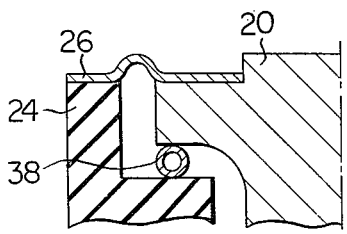
FIG. 8 is a fragmental longitudinal sectional view of a modification of one portion of the arrangement shown in FIG. 7.

Upon constructing flat package semiconductor devices having both the explosion proof ability and resistance to mechanical vibrations, that surface of each protrusion 34a or 34b contacting the O-ring 38 may preferably tilt toward the latter and merge into the adjacent peripheral electrode surface as shown in FIG. 8, for the pupose of increasing mechanical strength of the protrusion 34a. This is applicable to the protrusion 34b. In other words, the protrusion includes a roof portion gradually increased in axial dimension toward a roof thereof.

Figure 9:
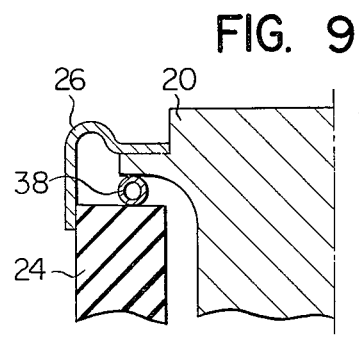
FIG. 9 is a view similar to FIG. 8 but illustrating a modification of the arrangement shown in FIG. 8.
Figure 10:
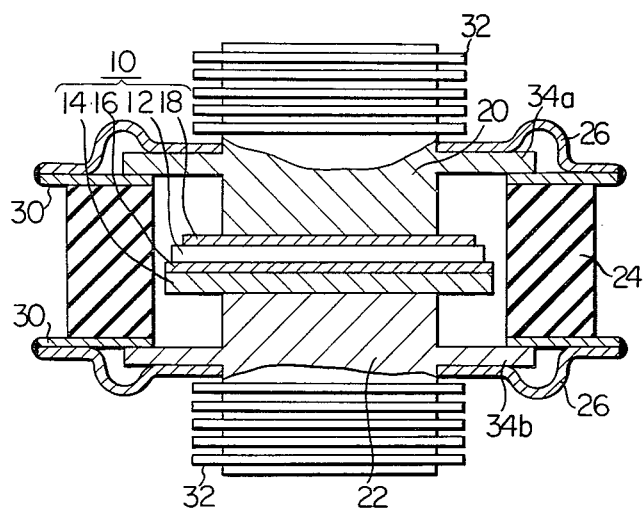
FIG. 10 is a longitudinal sectional view, partly in elevation, of another modification of the present invention with parts broken away.

The arrangement illustrated in FIG. 10 is different from that shown in FIG. 9 only in that in FIG. 10, 10, the protrusion 34a or 34b of the electrode 20 or 22 contacts directly the flange-shaped member 30 brazed on the adjacent end surface of the hollow cylinder 24 with the O-rings 38 omitted. Each protrusion 34a or 34b is deformable in the direction of thickness of the semiconductor element 12 and has a thickness of about 1 millimeter and a radial dimension or a width of from 2 to 3 millimeters.

As shown in FIG. 10, each protrusion 34a or 34b directly contacts the flange-shaped member 30 brazed to each end surface of the hollow cylinder 24 to block a passageway from the semiconductor element 12 leading to the associated flexible annulus 26 or 28. That is, the semiconductor element 12 is physically isolated from the flexible annuli 26. If the semiconductor element 12 changes in thickness then this change in thickness is accommodated through the deformation of the protrusions 34a, 34b and the flexible annuli 26 ensuring that the semiconductor elements 12 is maintained in intimate contact with both electrodes 20 and 22.

Figure 11:
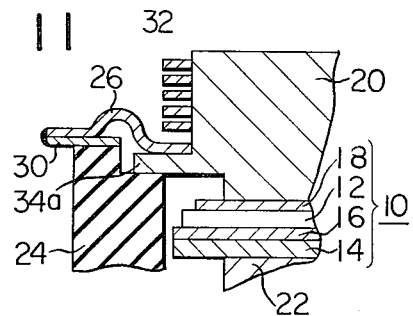
FIG. 11 is a longitudinal sectional view of a modification of one portion of the arrangement shown in FIG. 10.

In FIG. 11 the hollow, electrically insulating cylinder 24 is provided on the radially inner peripheral portion of the upper end surface with a circumferential step by removing party an inner surface of each end portion thereof. The step is put in compressive contact with the protusion 34a of the first or upper electrode 20. This is true in the case of the lower end surface of the second or lower electrode 22. The arrangement illustrated can be small-sized as compared with that shown in FIG. 10.

Figure 12:
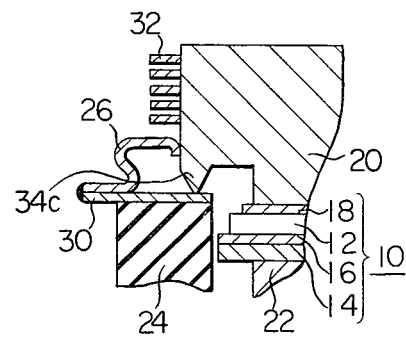
FIG. 12 is a view similar to FIG. 11 but illustrating a modification of the arrangement shown in FIG. 11.

In FIG. 12 the electrode 22 includes a radially outward directed extension except for that portion thereof adjacent to the semiconductor element 12 and an axial pointed protrusion 34c extends from the entire outer periphery of that extension to put in compressive contact with the flange-shaped member 30 brazed to the end surface of the hollow, electrically insulating cylinder 24. The protrusion 34c may have any desired section other than the section shown in FIG. 12 as long as the same is deformable in response to a pressure in excess of a predetermined magnitude applied thereto.

Also the protrusion 34c is applicable to the arrangement shown in FIG. 12.

Figure 13:
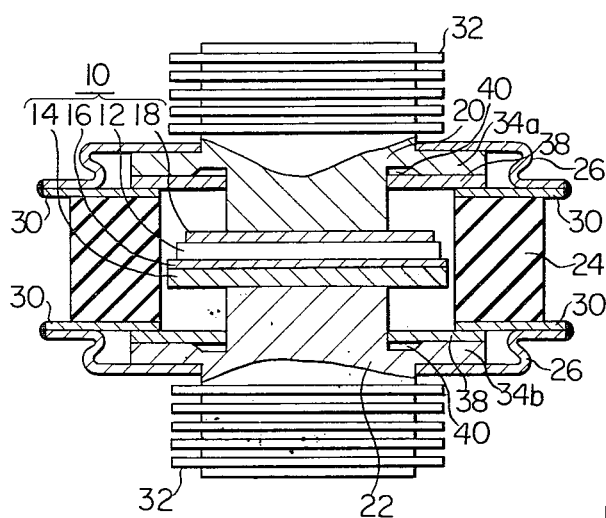
FIG. 13 is a view similar to FIG. 10 but illustrating still another modification of the present invention.

The arrangement illustrated in FIG. 13 is different from that shown in FIG. 10 only in that in FIG. 13 each of the protrusions 34a or 34b of the electrode 20 or 22 is maintained in compressive contact with the flange-shaped members 30 brazed to the adjacent end surfaces of the hollow cylinder 24 respectively through annular flat blocking member 38 abutting at one end against the mating electrode 20 or 22. The blocking member 28 is formed of a metallic material not easily elastic deformable and high in both melting point and heat of fusion. Examples of such a metallic material involve iron, nickel, copper, titanium, molybdenum, tungsten, alloys thereof etc. Alternatively, the blocking member 28 may be of an electrically insulating material such as any of alumina system ceramic porcelains.

Further the roof portion of the protrusion 34a is provide on that side thereof contacting the blocking member 28 with an annular recess to form an annular gap 40 therebetween.

In the embodiment of FIG. 13, the presence of the blocking member 38 eliminates a fear that in FIGS. 10 and 11, the protrusions 34a and 34b will be melted because they are thinned so as to be deformable in the direction of thickness of the semiconductor element 12. Also the presence of the annular gap 40 ensures that the semiconductor element 12 is maintained in compressive contact with the first and second main electrodes 20 and 22 respectively. This is because a change in thickness of the semiconductor element 12 which may occur for some reasons can be compensated for by the movement of the blocking member 40 moving into the annular gap 40 attended on the deformation of both flexible annuli 26 and the electrode protrusions 34a and 34b. Accordingly the arrangement of FIG. 13 is advantageous in that the blocking member 40 may be formed of any desired material that is not easily deformable.

In order to demonstrate the explosion proof ability of the present invention an explosion test has been conducted with two groups of flat package semiconductor devices including the semiconductor element composed of a silicon substrate having a diameter of 55 millimeters and a thickness of 0.6 millimeter. One of the two groups was constructed as shown In FIG. 1 while the other group was constructed as shown in FIG. 13.

According to the results of the tests concerning explosions caused from the shortcircuit current, the one group of the devices having the structure shown in FIG. 1 has been exploded with the square of current-time product $I^2t$ of $20\times10^6$ $A^2S$ or less whereas the other group of the devices having the structure shown in FIG. 13 has not been exploded with the square-of-current-time product of $55\times10^6$ $A^2S$ by using the blocking member 38 formed of sheet nickel or titanium having a thickness on the order of 1 millimeter.

Also a breaking test has been conducted with the two groups of the flat package semiconductor devices as above described by using flows of breaking surge short-circuit currents of 50, 100 and 165 kiloamperes. The results of the breaking tests indicate that the other group (FIG. 13) exhibits the resistance to breaking equal to about five times that exhibited by the one group (FIG. 1).

Figure 14:
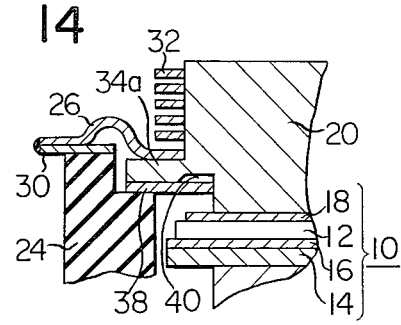
FIG. 14 is a fragmental longitudinal sectional view of a modification of one portion of the arrangement shown in FIG. 13.

In the arrangement illustrated in FIG. 14, the electrode protrusion 34a as shown in FIG. 11 is replaced by the protrusion 34a and underlaid with the blocking member 38 to form the annular gap 40 therebetween as shown in FIG. 13.

Figure 15:
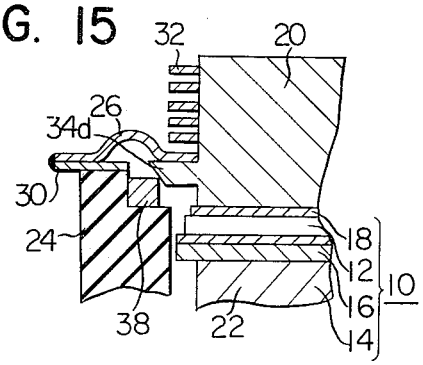
FIGS. 15 and 16 are views similar to FIG. 14 but illustrating different modifications of the arrangement shown in FIG. 14.

In the arrangement illustrated in FIG. 15, the annular block member 38 of square cross section is disposed on the circumferential step on the end surface of the hollow cylinder 24 such as shown in FIG. 11 and, put in compressive contact with the electrode protrusion 34a on the outer peripheral surface thereof that is bevelled toward the semiconductor element 12. A change in thickness of the semiconductor element 12 can be compensated for through the deformation of the bevelled peripheral surface of the protrusion 34a resulting from the blocking member 38.

Like the arrangement of FIG. 11, the arrangement shown in each of FIGS. 14 and 15 can be smalled-scaled as compared with the arrangement illustrated in FIG. 13.

Figure 16:
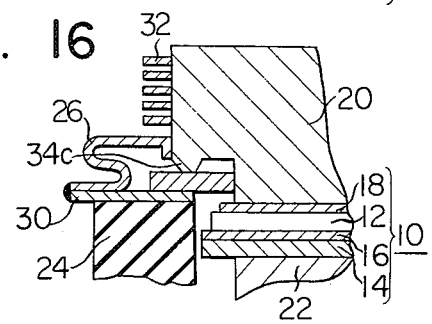

In the arrangement illustrated in FIG. 16, the axial protrusion 34c of the electrode 34a as shown in FIG. 12 is maintained in compressive contact with the annular blocking member 38 disposed on the end surface of the hollow cylinder 24 through the flange-shaped member 30 with the inner periphery thereof abutting against the outer periphery of the electrode 20 proper.

The arrangement of FIG. 16 may be applied to that shown in FIG. 14.

It is to be understood that the arrangements which are the reflected image of those shown in FIGS. 14 through 16 are operatively associated with the second electrode 22 as the arangements shown in FIGS. 8, 9, 11 and 12.

From the foregoing it is seen that, according to the present invention, thin metallic annuli connecting a pair of opposite electrode to a hollow electrically insulating cylinder respectively are suppressed from reaching rapidly their melting point to be melted and bored. Therefore, the resulting melted piecelets are prevented from scattering around the location of the flat package semiconductor device due to an explosion of an inert gas filling the interior of the device.

While the present invention has been illustrated and described in conjunction with various preferred embodiments thereof it is to be understood that numerous changes and modifications may be resorted to without departing from the spirit and scope of the present invention. For example, the present invention is equally applicable to a variety of flat package semiconductor devices other than those described above.

What we claim is:

1. A flat package semiconductor device comprising, in combination, a hollow electrically insulating cylinder, a pair of opposed electrodes disposed on opposite end surfaces of said hollow electrically insulating cylinder, a semiconductor element sandwiched between said pair of cylindrical electrodes, a thin metallic annulus hermetically connected to each of said end surfaces of said hollow electrically insulating cylinder and supporting each of said electrodes to form a hermetic enclosure with said hollow electrically insulating cylinder and said electrodes, said electrically insulating cylinder having an internal inwardly extending circumferential protrusion between said electrodes, a circumferential protrusion within said hermetic enclosure radially extending from each of said electrodes opposite said internal protrusion of said hollow electrically insulating cylinder and spaced axially therefrom, and means for isolating physically said circumferential protrusions and said semiconductor element from said electrically insulating cylinder and each of said thin metallic annuli, said means being maintained in a mechanically compressed state due to a pressure applied across said electrodes and said means maintaining said internal protrusion of said electrically insulating cylinder between said circumferential protrusions of said electrodes and permitting said electrodes to be displaced with respect to said electrically insulating cylinder axially thereof.

2. A flat package semiconductor device as claimed in claim 1 wherein said means is comprised of an annular resilient member interposed between the said circumferential protrusion of an electrode and said internal protrusion of said hollow, electrically insulating cylinder to isolate physically said semiconductor element from an adjacent one of said thin metallic annuli.

3. A flat package semiconductor device as claimed in claim 2 wherein said resilient member is higher in elastic force than said thin metalli annulus.

4. A flat package semiconductor device as claimed in claim 3 wherein said protrusion includes a roof portion gradually increased in axial dimension toward a roof thereof.

5. A flat package semiconductor device as claimed in claim 3 wherein said annular resilient member comprises a metallic O-ring.

6. A flat package semiconductor device as claimed in claim 2 wherein said annular resilient member is lower in elastic force than said thin metallic annulus.

7. A flat package semiconductor device as claimed in claim 2 wherein said annular resilient member is comprised of a metallic spring material.

8. A flat package semiconductor device as claimed in claim 2 wherein said resilient annulus is comprised of an electrically insulating material having elasticity.

9. A flat package semiconductor device as claimed in claim 1 wherein said protrusion is deformable in a direction of thickness of said semiconductor element.

10. A flat package semiconductor device as claimed in claim 9 wherein said protrusion is directly contacted by said hollow electrically insulating cylinder to isolate physically said semiconductor element from an adjacent one of said metallic annuli.

11. A flat package semiconductor device as claimed in claim 1 wherein an annular blocking member is interposed between said protrusion and said hollow, electrically insulating cylinder to isolate physically said semiconductor element from an adjacent one of said thin metallic annuli, said blocking member is not elastically deformable.

12. A flat package semiconductor device as claimed in claim 11 wherein said blocking member is formed of a material high in both melting point and heat of fusion.

13. A flat package semiconductor device as claimed in claim 12 wherein said material is metallic.

14. A flat package semiconductor device as claimed in claim 12 wherein said material is an electrical insulator.

15. A flat package semiconductor device as claimed in claim 1 wherein said protrusion is contacted by an adjacent end surface of said hollow, electrically insulating cylinder.

16. A flat package semiconductor device as claimed in claim 1 wherein said protrusion is contacted by another protrusion radially inward extending from the entire inner periphery of said hollow electrically insulating cylinder to isolate physically said semiconductor element from an adjacent one of said thin metallic annuli.

17. A flat package semiconductor device as claimed in claim 16 wherein said another protrusion on said hollow electrically insulating cylinder is formed by removing partly an inner surface of each end portion of said hollow, electrically insulating cylinder.

* * * * *